United States Patent [19]

Melton et al.

[11] Patent Number: 5,435,838
[45] Date of Patent: Jul. 25, 1995

[54] IMMERSION PLATING OF TIN-BISMUTH SOLDER

[75] Inventors: Cynthia M. Melton, Bolingbrook; Alicia Growney, Barrington; Harry Fuerhaupter, Lombard, all of Ill.

[73] Assignee: Motorola, Inc., Schaumburg, Ill.

[21] Appl. No.: 334,998

[22] Filed: Nov. 7, 1994

Related U.S. Application Data

[62] Division of Ser. No. 160,769, Dec. 3, 1993, Pat. No. 5,391,402.

[51] Int. Cl.$^6$ ............................................. C23C 18/48
[52] U.S. Cl. ................................. 106/1.22; 106/1.25
[58] Field of Search ............................ 106/1.22, 1.25

[56] References Cited

U.S. PATENT DOCUMENTS

| | | | |
|---|---|---|---|
| 3,663,384 | 5/1972 | Lescure | 204/43 |
| 4,331,518 | 5/1982 | Wilson | 205/253 |
| 4,511,403 | 4/1985 | Orio et al. | 106/1.22 |
| 4,582,576 | 4/1986 | Opaskar et al. | 106/1.22 |
| 4,715,894 | 12/1987 | Holtzmann et al. | 106/1.22 |
| 4,717,460 | 1/1988 | Nobel et al. | 205/290 |
| 5,039,576 | 8/1991 | Wilson | 428/626 |
| 5,135,574 | 8/1992 | Konishi et al. | 106/1.22 |
| 5,143,544 | 9/1992 | Iantosca | 106/1.22 |
| 5,147,454 | 9/1992 | Nishihara et al. | 106/1.22 |
| 5,160,422 | 11/1992 | Nishimura et al. | 205/254 |
| 5,227,046 | 7/1993 | Murphy et al. | 205/252 |
| 5,269,838 | 12/1993 | Inoue et al. | 106/1.22 |
| 5,302,256 | 4/1974 | Miura et al. | 427/437 |

*Primary Examiner*—Helene Klemanski
*Attorney, Agent, or Firm*—Douglas D. Fekete

[57] ABSTRACT

An electroless immersion plating process for depositing a tin-bismuth plate onto a surface formed of copper or the like comprises immersing the surface into an acidic aqueous solution comprising a tin alkane sulfonate compound, preferably tin methane sulfonate, and a bismuth alkane sulfonate compound, preferably bismuth methane sulfonate. The solution also contains thiourea in an amount effective to reduce tin at the surface. The bismuth compound is added in an amount to produce a bismuth concentration that is less than about 1.0 gram per liter. Furthermore, the ratio of tin to bismuth in the solution is at least 30 to 1, and preferably at least 50 to 1. The process deposits a dense, adherent plate composed of a tin-bismuth alloy containing at least 50 weight percent tin and preferably containing greater than 70 weight percent tin, which plate is well suited for use in microelectronic soldering operations.

6 Claims, No Drawings

IMMERSION PLATING OF TIN-BISMUTH SOLDER

This is a division of application Ser. No. 08/160,769, filed on Dec. 3, 1994 now U.S. Pat. No. 5,391,402.

BACKGROUND OF THE INVENTION

This invention relates to an electroless immersion process for plating a tin bismuth solder alloy, and, more particularly, to such electroless plating process for plating a tin bismuth alloy comprising greater than 50 weight percent tin and preferably greater than 70 weight percent tin.

In the manufacture of microelectronic packages, it is known to plate a solder alloy onto a metallic surface of a printed circuit board or similar substrate. Solder plate is applied, for example, to a bond pad of a copper circuit trace in preparation to attaching a component by a surface mounting operation. A typical solder for this purpose is formed of a low-melting, near-eutectic tin-lead alloy. One process for forming the solder plate involves electrodeposition. The substrate is immersed in an aqueous solution containing tin ions and lead ions and is cathodically biased to reduce the ions to metal and co-deposit tin and lead metals. This technique requires electrical connections to the substrate to distribute the plating current. Alternately, the solder may be deposited electrolessly by immersing the substrate in a solution containing tin and lead compounds and also containing an agent effective to reduce the tin and lead at the metal surface. A preferred process utilizes an acidic solution comprising tin methane sulfonate, lead methane sulfonate, and thiourea. Electroless deposition has advantages by avoiding the need for electrical connections and in producing a more uniform plate thickness regardless of the configuration of the underlying metal surface.

For some applications, it is desired to employ a lead-free solder formed of an alloy of tin and bismuth, in contrast to the tin-lead solder alloy. Alloy containing a relatively high tin content, preferably greater than 70 weight percent, is preferred to provide a high ductility to minimize crack formation, while also comprising sufficient bismuth to reduce the melting point to facilitate subsequent soldering operations. Heretofore, an electroless deposition process has not been available for plating such tin bismuth alloy. This is attributed to the fact that, unlike tin and lead which require the addition of an agent such as thiourea to deposit the metal, bismuth deposits spontaneously onto copper and forms a deposit that is porous and has poor adhesion to the underlying copper, as evidenced by spalling. Thus, there is a need for an electroless immersion process for plating tin bismuth alloy onto a copper surface that produces a dense, adherent plate containing tin and bismuth in proportions suitable for soldering operations.

SUMMARY OF THE INVENTION

This invention contemplates an electroless immersion plating process for depositing a tin-bismuth plate onto a surface formed of copper or the like. The process comprises immersing the substrate into an acidic aqueous solution comprising a tin alkane sulfonate compound, preferably tin methane sulfonate, and a bismuth alkane sulfonate compound, preferably bismuth methane sulfonate. The solution also contains thiourea in an amount effective to reduce tin at the surface. The bismuth compound is added in an amount to produce a bismuth concentration that is less than about 1.0 gram per liter. Furthermore, the ratio of tin to bismuth in the solution is at least 30 to 1, and preferably at least 50 to 1. It is surprisingly found that, despite the spontaneous bismuth reaction, the solution formulated in accordance with this invention is effective to deposit a dense, adherent plate containing at least 50 weight percent tin and preferably containing greater than 70 weight percent tin. Thus, this invention produces a plate composed of a tin bismuth alloy that is well suited for use in soldering operations.

DETAILED DESCRIPTION OF THE PREFERRED EMBODIMENT

In accordance with the preferred embodiment of this invention, a plate composed of tin-bismuth solder alloy is deposited onto a metallic copper surface by an electroless immersion process that employs an aqueous acidic solution comprising tin methane sulfonate, bismuth methane sulfonate and thiourea. A suitable acidic solution is prepared by dissolving between about 100 and 150 grams per liter of methane sulfonic acid in water. Tin methane sulfonate is dissolved in an amount sufficient to produce a tin concentration between about 30 and 100 grams per liter. A preferred tin concentration is between about 30 and 40 grams per liter. Similarly, bismuth methane sulfonate is dissolved to produce a bismuth concentration between about 0.2 and 1.0 grams per liter and preferably between about 0.2 and 0.6 grams per liter. The relative proportions of tin methane sulfonate and bismuth methane sulfonate are selected so as to produce a ratio of tin to bismuth in the solution that is at least 30 to 1 and preferably at least 50 to 1. Within these ranges of tin and bismuth compounds, thiourea concentrations between about 40 and 150 grams per liter are generally effective to deposit the tin alloy. Preferably, the thiourea was between 80 and 100 grams per liter. Optionally, the solution may contain other additives, such as citric acid or chloride ions, to enhance deposition or to improve the physical or mechanical properties of the plate.

A substrate bearing the copper surface is immersed in the solution to deposit the plate. The solution temperature is preferably between about 30° C. and 35° C., although suitable deposits have been obtained at temperatures between about 25° C. and 70° C. In general, solutions containing the preferred tin and bismuth additions with thiourea are effective to deposit a plate having a thickness between about 0.5 and 1.5 microns following immersion for between about 0.5 and 1.5 minutes, although faster plating rates may be obtained by additions of an accelerant such as chloride ions. Plates having thicknesses up to about 2.0 microns have been deposited using extended immersion times up to about 5 minutes. It is found that plates produced by the process of this invention are dense and adhere tightly to the underlying copper so as to resist spalling. Moreover, the plates contain at least 50 weight percent tin and preferably at least 70 weight percent tin, with the balance being bismuth. Thus, the plated alloy is well suited for use as solder.

The following are examples of tin bismuth solder alloys deposited onto copper substrates in accordance with preferred examples of this invention.

EXAMPLE 1

An electroless plating solution was suitably formulated to contain about 130 grams per liter methane sulfonic acid, about 83 grams per liter tin methane sulfonate (corresponding to a tin concentration of about 32 grams per liter), about 1.4 grams per liter bismuth methane sulfonate (corresponding to a bismuth concentration of about 0.6 gram per liter) and 95 grams per liter thiourea in water. The tin compound was added using a commercially available concentrate solution composed of 24 weight percent tin methane sulfonate and 30 weight percent methane sulfonic acid. The bismuth was added by a commercially available concentrate solution containing 33 weight percent bismuth methane sulfonate and 14 weight percent methane sulfonic acid. The remainder of the acid was added as a 40 weight percent concentrate solution. The ratio of tin to bismuth in solution was about 54 to 1.

A substrate comprising a metallic copper layer applied to a polymeric carrier was immersed in the solution at a temperature of 30° C. for approximately 30 seconds. During immersion, a dense, adherent tin-bismuth plate having a thickness of about 1 micron was deposited onto the copper surface. The plate was analyzed and found to contain about 70.3 percent tin and the balance substantially bismuth.

EXAMPLE 2

An electroless plating solution was formulated as in Example 1, but containing bismuth methane sulfonate in an amount effective to produce a bismuth concentration of 1.0 gram per liter. The resulting tin-to-bismuth ratio was 32:1. A plate deposited onto a copper surface immersed in the solution was composed of about 51.5 weight percent tin and the balance bismuth.

EXAMPLE 3

An electroless plating solution was formulated as in Example 1, but containing bismuth methane sulfonate in an amount effective to produce a bismuth concentration of 0.2 gram per liter. The resulting tin-to-bismuth ratio was 160:1. A plate deposited onto a copper surface immersed in the solution was composed of about 88.8 weight percent tin and the balance bismuth.

EXAMPLE 4

An electroless plating solution was formulated as in Example 1, but also including an addition of 35 grams per liter citric acid. A substrate comprising a metallic copper surface was immersed in the solution at a temperature of 30° C. for approximately 30 seconds. During this time, a dense, adherent tin-bismuth plate having a thickness of about 1.0 micron and containing about 70 weight percent tin, the balance bismuth, was deposited onto the copper surface. In comparison to the plate produced in Example 1, the addition of citric acid produced a plate having a significantly smoother surface as determined using a profilometer. In general, citric acid additions between about 30 and 50 grams per liter have been found to be effective to improve surface finish of plates produced by solutions having tin and bismuth concentrations within the preferred ranges.

EXAMPLE 5

An electroless plating solution was formulated as in Example 1, but also including an addition of hydrochloric acid in an amount effective to produce a 0.2 molar chloride ion concentration. A substrate comprising a metallic copper surface was immersed in the solution at a temperature of 30° C. for approximately 30 seconds. During this time, a dense, adherent tin-bismuth plate deposited onto the copper surface containing about 70 weight percent tin and having a thickness of about 2.0 microns. In comparison to the plate produced in Example 1, the addition of hydrochloric acid increased the rate of metal deposition, without significantly affecting the composition of the plated alloy. In general, chloride additions between about 0.1 and 0.3 molar increase deposition rates for the solutions formulated in accordance with the preferred embodiments of this invention.

COMPARATIVE EXAMPLE 1

For purposes of comparison, a substrate comprising a tin layer was immersed in a bath comprising about 12.4 grams per liter tin methane sulfonate, about 19.8 grams per liter bismuth methane sulfonate, 105 grams per liter methane sulfonic acid, and about 100 grams per liter thiourea. This solution is comparable to commercially available solutions for electroless immersion plating of tin lead alloys, but contains bismuth in substitution for lead methane sulfonate. The resulting plate was coarse and exhibited poor adhesion to the underlying copper. The plate was analyzed and found to contain greater than 97 weight percent bismuth.

Therefore, the electroless immersion plating process of this invention utilizes an aqueous acidic solution to produce a metallic deposit composed of a tin-bismuth alloy having a composition useful as solder plate. In general, for solder plate, it is desired to employ a tin-rich alloy having a composition containing at least 50 weight percent tin, in contrast to high bismuth alloys that tend to be coarse and brittle, and are not suitable for use as a protective coating on copper to facilitate soldering operations. Thus, this invention is adapted to deposit an alloy containing at least 50 weight percent tin and preferably greater than 70 weight percent tin. While not limited to any particular theory, it is believed that the uncontrolled, spontaneous reaction of bismuth at the copper surface interferes with the desired reactions involving tin and thiourea to prevent the deposition of tin. In contrast, in the process of this invention, the reaction of bismuth is suitably controlled to permit the simultaneous reaction of tin and thiourea to deposit tin at a rate sufficient to form a tin-rich alloy. This is accomplished by formulating a plating solution containing less than 1.0 gram per liter bismuth, added as bismuth methane sulfonate, and having a ratio of tin to bismuth of at least 30 to 1 and preferably at least 50 to 1. Preferably, the bismuth concentration is between about 0.2 and 0.6 grams per liter. Also, the solution contains thiourea in an amount effective to interact with tin ions at the surface to deposit metallic tin. It is found, that, whereas spontaneous and uncontrolled bismuth deposition occurs in a manner that inhibits the reactions between tin and thiourea and produces a bismuth plate that is porous and spalls, the electroless plating process of this invention is effective to concurrently plate the tin and the bismuth in the desired solder proportions and, of equal significance, produces a plate that is dense and tightly adheres to the underlying copper.

While this disclosure has been made in terms of solutions containing tin and bismuth methane sulfonate, other alkane sulfonates, such as ethane sulfonates, may be substituted for the methane sulfonates utilized in the preferred embodiment. In addition, additives may be included in the bath to improve the mechanical or physical properties of the plate. In addition to citric acid and chloride ions, other suitable additives include wetting agents and surfactants, as well as tin or bismuth chelating agents to improve dissolution of the ions in solution.

While this invention has been described in terms of certain embodiments, it is not intended that it be limited to the above description, but rather only to the extent set forth in the claims that follow.

The embodiments of the invention in which an exclusive property is claimed are defined as follows:

1. An electroless immersion plating solution for depositing a tin-bismuth plate onto a metal surface, said electroless immersion plating solution comprising
   an acidic aqueous solution comprising a tin alkane sulfonate compound, a bismuth alkane sulfonate compound and thiourea, said acidic aqueous solution containing tin and bismuth in concentrations such that the bismuth concentration is less than about 1.0 gram per liter and the ratio of tin concentration to bismuth concentration is at least 30 to 1.

2. An electroless immersion plating solution in accordance with claim 1 wherein the tin alkane sulfonate compound is tin methane sulfonate and the bismuth alkane sulfonate compound is bismuth methane sulfonate.

3. An electroless immersion plating solution in accordance with claim 1 wherein the acidic aqueous solution comprises between about 100 and 150 grams per liter methane sulfonic acid, between about 30 and 100 grams per liter tin added as tin methane sulfonate, between about 0.2 and 1.0 gram per liter bismuth added as bismuth methane sulfonate, and between about 80 and 100 grams per liter thiourea, said acidic aqueous solution comprising a ratio of tin concentration to bismuth concentration of at least 30 to 1 and effective to deport a tin bismuth alloy containing at least 50 weight percent tin and the balance bismuth.

4. An electroless immersion plating solution in accordance with claim 1 wherein the acidic aqueous solution comprises between about 100 and 150 grams per liter methane sulfonic acid, tin methane sulfonate in an amount effective to produce a tin concentration between about 30 and 40 grams per liter, bismuth methane sulfonate in an amount effective to produce a bismuth concentration between about 0.2 and 0.6 gram per liter, and between about 80 and 100 grams per liter thiourea, said solution comprising a ratio of tin concentration to bismuth concentration of at least 50 to 1 and effective to deposit a tin bismuth alloy composed of at least 70 weight percent tin and the balance bismuth.

5. An electroless immersion plating solution in accordance with claim 1 wherein the acidic aqueous solution further comprises between about 30 and 50 grams per liter citric acid.

6. An electroless immersion plating solution in accordance with claim 1 wherein the acidic aqueous solution further comprises between about 0.1 and 0.3 molar chloride ions.

* * * * *

UNITED STATES PATENT AND TRADEMARK OFFICE
CERTIFICATE OF CORRECTION

PATENT NO. : 5,435,838

DATED : July 25, 1995

INVENTOR(S) : Cynthia M. Melton, Alicia Growney, Harry Fuerhaupter

It is certified that error appears in the above-identified patent and that said Letters Patent is hereby corrected as shown below:

In the Claims:

At column 6, line 6, "deport" should be --deposit--.

Signed and Sealed this

Nineteenth Day of December, 1995

Attest:

BRUCE LEHMAN

*Attesting Officer*  *Commissioner of Patents and Trademarks*